United States Patent [19]

Mashiro

[11] Patent Number: 5,502,355
[45] Date of Patent: Mar. 26, 1996

[54] PLASMA PROCESSING APPARATUS FOR PRODUCING HIGH DENSITY PLASMA

[75] Inventor: Supica Mashiro, Tokyo, Japan

[73] Assignee: Anelva Corporation, Tokyo, Japan

[21] Appl. No.: 345,458

[22] Filed: Nov. 21, 1994

[30] Foreign Application Priority Data

Nov. 30, 1993 [JP] Japan .................... 5-299929

[51] Int. Cl.⁶ .................................................... H01J 7/24
[52] U.S. Cl. ................... 315/111.21; 315/111.71; 313/231.31; 313/240; 313/268
[58] Field of Search .................. 315/111.21, 111.71, 315/111.81; 219/121.36, 121.49, 121.52, 121.43; 313/231.31, 240, 241, 268

[56] References Cited

U.S. PATENT DOCUMENTS

| | | | |
|---|---|---|---|
| 4,985,114 | 1/1991 | Okudaira et al. | 156/643 |
| 5,173,641 | 12/1992 | Imahashi et al. | 315/111.21 X |
| 5,252,892 | 10/1993 | Koshiishi et al. | 315/111.21 X |
| 5,320,982 | 6/1994 | Tsubone et al. | 437/228 |

FOREIGN PATENT DOCUMENTS

62-69620  3/1987  Japan .

*Primary Examiner*—Robert J. Pascal
*Assistant Examiner*—Haissa Philogene
*Attorney, Agent, or Firm*—Sughrue, Mion, Zinn, Macpeak & Seas

[57] ABSTRACT

A plasma processing apparatus capable of widening a distance of a narrow gap formed along peripheral portions of the opposed electrodes without deterioration of the efficiency. In the apparatus, two electrodes are provided in parallel to each other within a vacuum processing chamber, and a surface of a wafer supported by either one of these electrodes is processed by reactive gas plasma produced between the electrodes by applying high frequency power to one of the electrodes, a narrow gap portion whose gap distance is narrower than that of an opposite space sandwiched between central portions of the two electrodes is formed along peripheral portions of the two electrodes, an ground shield made of conductive material is provided via an insulating member so as to cover the outer side surface of one electrode, the ground shield covers an outer surface of the electrode, and an annular extension portion which extends into the narrow gap portion is provided inside an edge portion of the ground shield.

7 Claims, 4 Drawing Sheets

PLASMA PROCESSING APPARATUS FOR PRODUCING HIGH DENSITY PLASMA

BACKGROUND OF THE INVENTION

The present invention relates to a plasma processing apparatus to improve the efficiency of utilization of high frequency power by increasing the density of plasma produced between electrodes, which is Utilized as a dry etching apparatus, for example.

Conventionally, the plasma processing apparatuses in which parallel plate electrodes are opposite each other, i.e. opposed electrodes, are provided within a vacuum processing chamber have generally been employed in etching processes for manufacturing semiconductor devices. In particular, with increases in the diameters of wafers, plasma processing apparatuses of a so-called single wafer processing type, in which the wafers are processed one by one, have become popular.

In order to improve the productivity of the plasma processing apparatus of this single wafer processing type, the processing speed thereof must be increased by one figure compared to that of another conventional plasma processing apparatus of a so-called batch processing type in which a large number of wafers are processed at a time.

As a means for increasing the processing speed of plasma processing, a plasma processing apparatus of a so-called narrow gap type has been known in the art as shown in JP-A-62-69620, for example. In this narrow gap type plasma processing apparatus, the gap distance between parallel plate electrodes located opposite each other is selected to be approximately 10 mm. Further, an annular narrow gap constructive member made of insulating material is provided along the peripheral portions of the parallel plate electrodes so that a narrow gap in a range of 1 to 2 mm, which is narrower than the above-described distance of the parallel plate electrodes, is formed along the peripheral portions of the parallel plate electrodes. By the provision of the thus constructed narrow gap, when the high frequency power is applied between the parallel plate electrodes, reactive gas plasma produced between the parallel plate electrodes can be confined in a space between these electrodes inside the narrow gap to thereby increase the density of plasma, so that the efficiency in utilization of the high frequency power is improved and the processing speed is increased (refer to FIG. 4).

FIG. 4 schematically shows a parallel plate electrode unit or an opposed electrode unit provided within the vacuum processing chamber 1 of the conventional dry etching apparatus. The opposed electrode unit includes an electrode 2 to which high frequency power is supplied and another electrode 3 which is provided at the wall portion of the vacuum processing chamber 1 and is biased at the ground potential. An annular narrow gap forming member 19 made of insulating material is arranged along the peripheral portions of the electrodes 2 and 3, so that an narrow gap portion 4 having an interval narrower than that between the central portions of the parallel plate electrodes which are positioned within the narrow gap constructive member is formed.

An insulating member 11 (manufactured, for example, by polytetrafluoroethlene) is provided which covers the outer side surface and also the lower surface of the electrode 2. An ground shield 12 made of conductive material (e.g., aluminum) is provided on the outer side surface and lower surface of the insulating member 11.

The other electrode 3 is provided along the wall portion of the vacuum processing chamber 1 and is biased at the ground potential. A large quantity of small through-holes or bores 14 are formed in the central portion of the electrode 3 so as to penetrate therethrough at an area of the electrode 3 that covers a wafer 5 positioned opposite the electrode 3. A gas reservoir 15 is formed between the electrode 2 and the wall portion of the vacuum processing chamber 1, so that reactive gas (for example, a mixture of CF4 and CHF3) which has been introduced into the gas reservoir 15 through a gas conductive tube 7 can be uniformly introduced into a space 16 sandwiched between the electrodes 2 and 3 and hence also introduced uniformly over the entire surface of the wafer 5.

An annular cover ring 17 made of insulating material is provided at the peripheral portion of the electrode 3 in order to form the narrow gap portion 4 together with the narrow gap forming member 19. A cylindrical ground shield 18 made of conductive material is provided on the outside of the cover ring 17.

According to the plasma processing apparatus having an opposed electrode unit constructed thus as shown in FIG. 4, when the gas is conducted into the space 16 between the electrodes 2 and 3, and high frequency power is applied to the electrode 2, discharge will occur between the electrodes 2 and 3, producing plasma. In this case, since the discharge impedance is high at the portion of the narrow gap forming member 19 made of the insulating material provided at the peripheral portion of the electrode 2, the discharge phenomenon is prevented at the portion of the narrow gap forming member. As a consequence, discharge phenomenon is uniformly concentrated onto the surface of the electrode 2 which is surrounded by the narrow gap forming member 19, whereby the plasma processing operation can be uniformly carried out at high efficiency and at a high speed.

In the conventional narrow gap type plasma processing apparatuses, for example etching apparatuses, a high-speed plasma processing operation can be realized by making the interval between the parallel plate electrodes narrower, increasing the pressure of the gas conducted into the space between the electrodes, and confining the plasma within a region where the wafer is processed.

In the conventional etching apparatuses, the processing precision can be achieved such that the line width is 0.8 micrometers and the aspect ratio is on the order of 1.5. In accordance with the demands for fineness (for instance, line widths of 0.5 micrometers or less and aspect ratios of 2.0 or more) of semiconductor devices, it has been required that pressure in the space between the parallel plate electrodes is lowered (10 Pa or less) to enhance the direct impingement property of particles in the reactive gas plasma which contributes to the processing of the wafer surface. That is, the particles such as ions and active radicals directly impinge on the wafer surface without scattering. However, the above-mentioned narrow gap type plasma processing apparatus has a problem or difficulty in lowering the pressure in the space between the parallel plate electrodes, since the narrow gap portion forms low conductance with respect to exhaust in the space between the electrodes at the central portions thereof, whereby this narrow gap portion would hinder such requirements.

When the narrow gap is designed to be, for instance, 1 mm, even if the vacuum processing chamber is exhausted to achieve internal pressure of approximately 5 Pa, the pressure in the space between the electrodes would be on the order of 40 Pa. Accordingly, the above-mentioned object to enhance the direct impingement property could not be achieved.

SUMMARY OF THE INVENTION

The present invention has been made in attempt to solve the above-described problems, and has an object to provide such a plasma processing apparatus that a distance of a narrow gap formed along peripheral portions of opposed electrodes are made extensible in order to confine plasma in a space located between the opposed electrodes.

To achieve the above-described object, a plasma processing apparatus according to the present invention, in which two electrodes are provided in parallel and opposite each other within a vacuum processing chamber, and a surface of a substrate (wafer) to be processed which is supported by either one of the two electrodes is processed by reactive gas plasma produced between the two electrodes by applying high frequency power to one of the two electrodes. A narrow gap portion whose gap distance is narrower than a distance between central portions of the two electrodes is formed along the peripheries of the two electrodes. An ground shield made of conductive material is provided around the one electrode to which the high frequency power is applied so that the ground shield covers an outer side surface of the one electrode, and an annular extension portion which extends into the narrow gap portion is provided inside an edge portion of the ground shield.

An annular cover ring made of insulating material which has an opening portion larger than the substrate to be processed is provided on a surface, positioned opposite that of the other electrode of the two electrodes, of the one electrode to which the high frequency power is applied, so that the cover ring may cover the annular extension portion of the ground shield.

An insulating member may be interposed between the ground shield and the outer side surface of the one electrode to which the high frequency power is applied.

The cover ring is designed to have a width capable of maintaining the insulation withstanding voltage between the one electrode and the inner edge portion of the annular extension portion of the ground shield. For instance, this width of the cover ring is selected to be approximately 2 to 20 mm when the high frequency power applied to the one electrode has a frequency of 13.56 MHz and a power of 1.0 to 2.0 kW.

Furthermore, an annular cover ring made of insulating material may be provided on the other electrode positioned opposite the one electrode to which the high frequency power is applied so that the annular cover ring covers the outer peripheral portion of the other electrode. Furthermore, an ground shield made of conductive material may be provided on the outer side of the cover ring. The ground shield may be provided with an annular extension portion which extends into the narrow gap portion, inside the edge portion of the earth shield.

In accordance with the plasma processing apparatus of the present invention, the annular extension portion of the earth shield extends into the narrow gap portion so that discharge in the narrow gap portion could be suppressed. As a result, since the distance of the narrow gap portion is widened, the conductance of the narrow gap portion is increased, so that the pressure in the space between the two electrodes can be easily lowered.

In a dry etching apparatus according to the invention, the distance of the narrow gap can be widened to lower the pressure in the space at where the plasma is confined to etch the wafer. Therefore, the etching rate in the fine patterning can be increased.

DETAILED DESCRIPTION OF PREFERRED EMBODIMENTS

A plasma processing apparatus according to the present invention will now be described with reference to the accompanying drawings, based on an example in which the present invention is applied to a dry etching apparatus.

Figure 1:
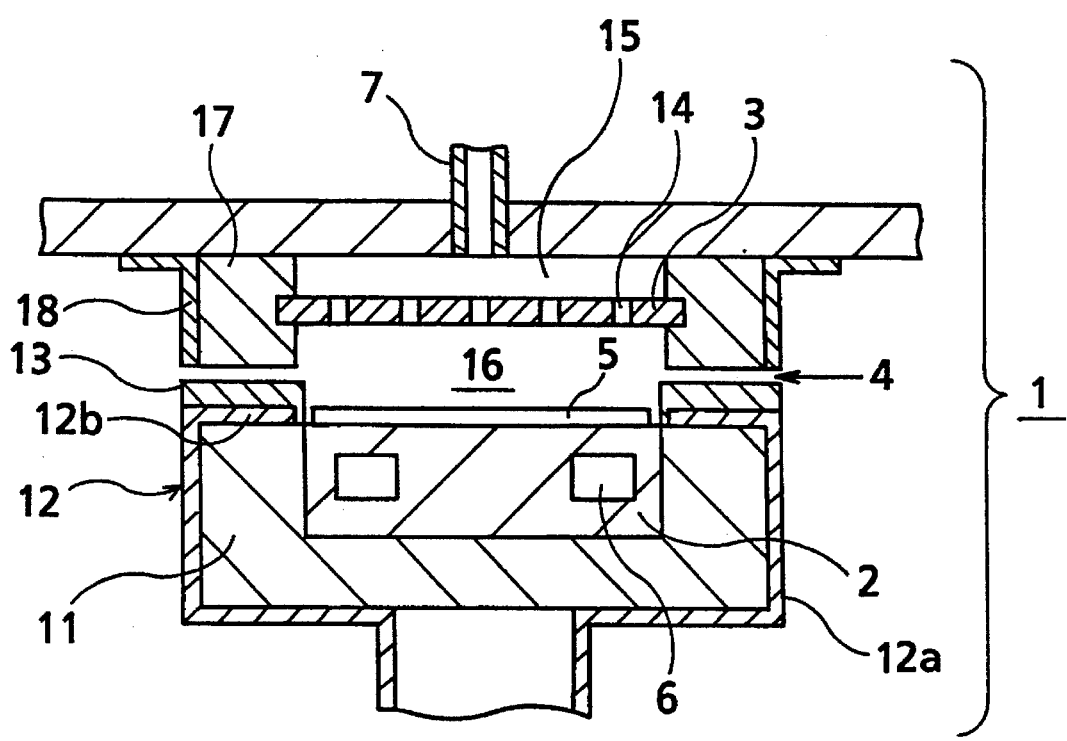
FIG. 1 is a schematic sectional view showing an opposed electrode unit of a plasma processing apparatus according to an embodiment of the present invention.

FIG. 1 is a sectional view showing a parallel plate electrode unit, or an opposed electrode unit, installed within a vacuum processing chamber 1 of the dry etching apparatus according to an embodiment of the present invention. The opposed electrode unit includes an electrode 2 to which high frequency power is supplied, and another electrode 3 which is provided at the wall portion of the vacuum processing chamber 1 and is biased at the ground potential. An annular narrow gap portion 4 having a distance narrower than that between the central portions of the parallel plate electrodes or opposed electrodes is formed along the peripheral portions of the electrodes 2 and 3.

The electrode 2 to which the high frequency power is applied is so designed that a wafer 5 corresponding to a substrate to be processed can be mounted at the central portion of the upper surface of the electrode 2. Cooling water paths 6 for cooling the wafer 5 are formed within the electrode 2.

An insulating member 11 (manufactured, for example, by polytetrafluoroethlene) is provided so as to cover the outer side surface and also lower surface of the electrode 2. An ground shield 12 made of conductive material (e.g. aluminum) is provided on the outer surface of the insulating member 11.

The ground shield 12 has a cylindrical portion 12a provided on the outer surface of the insulating member 11 so as to cover the outer side surface and the lower surface of the electrode 2 through the insulating member 11, and also has an annular extension portion 12b provided on the upper side of the insulating member 11 so as to extend into the narrow gap portion 4. While both of the cylindrical portion 12a and the annular extension portion 12b are formed integrally as one body in the embodiment described above, the present invention is not limited thereto and these portions may be formed separately.

An annular cover ring 13 made of insulating material (for example, alumina ceramics) is mounted above the upper side of the insulating member 11 in such a manner that this cover ring is interposed between the edge portion of the wafer 5 and the inner edge portion of the annular extension portion 12b formed in the earth shield 12. The outer peripheral portion of the cover ring 13 is overlaid on the upper surface of the annular extension portion 12b of the ground shield 12 to cover the annular extension portion 12b.

The cover ring 13 is provided in order to prevent discharge occurring between the wafer 5 and the ground shield 12, but there are also cases where the cover ring 13 is not employed.

The other electrode 3 is provided along the wall portion of the vacuum processing chamber 1 and is biased at the ground potential. A large quantity of small through-holes or bores 14 are formed in the central portion of the electrode 3 so as to penetrate therethrough at an area of the electrode 3 opposite the wafer 5. A gas reservoir 15 is formed between the electrode 2 and the wall portion of the vacuum processing chamber 1, so that a reactive gas (for example, a mixture of CF4 and CHF3) which has been introduced into the gas reservoir 15 through a gas conductive tube 7 can be uniformly introduced into an opposing space 16 sandwiched between the electrodes 2 and 3, and hence also introduced uniformly over the entire surface of the wafer 5.

An annular cover ring 17 made of insulating material is provided on the peripheral portion of the electrode 3 in order to form the narrow gap portion 4. A cylindrical earth shield 18 made of conductive material is provided on the outside of the cover ring 17.

Figure 2A:
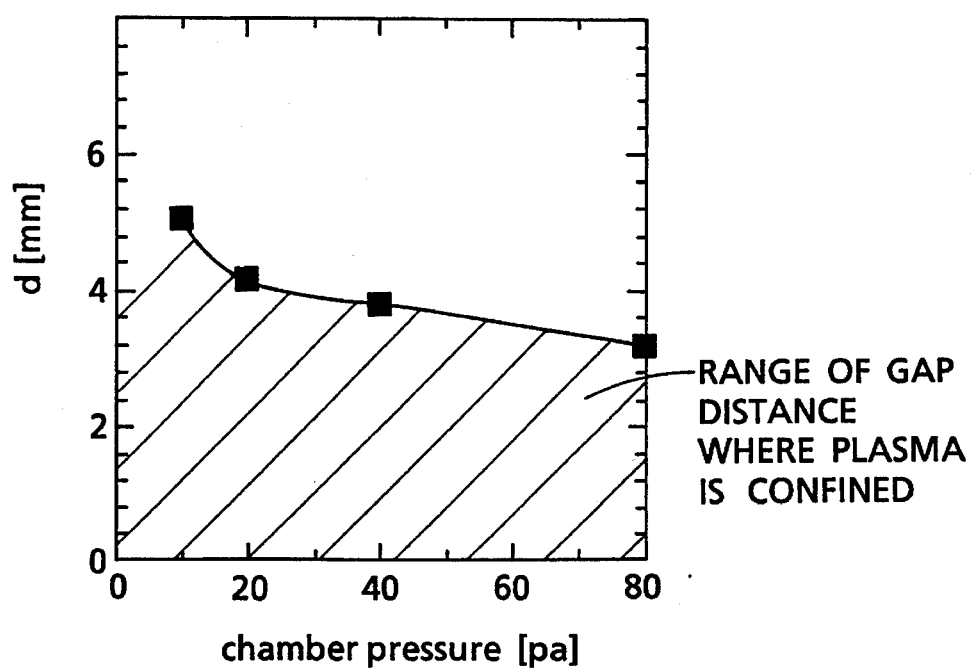
FIG. 2A is a graph showing characteristics of the plasma confinement effects according to an embodiment.
Figure 2B:
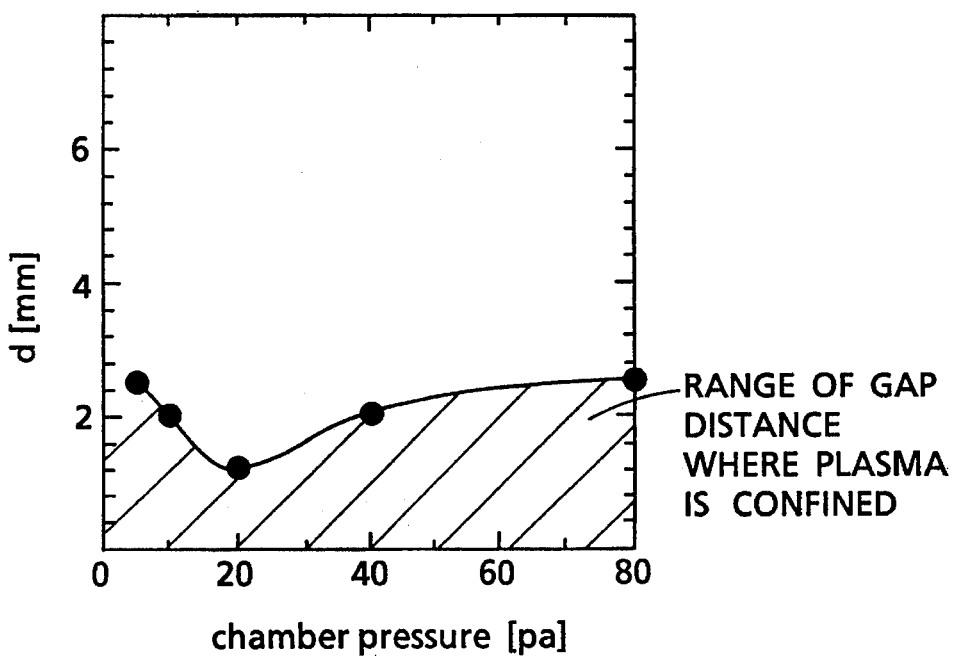
FIG. 2B is a graph showing characteristics of the plasma confinement effects of a conventional plasma processing apparatus.

FIGS. 2A and 2B respectively show measurement results of the confining effects of the reactive gas plasma according to the plasma processing apparatus of the above-described embodiment and the conventional plasma processing apparatus. That is, FIG. 2A shows the measurement results of the confining effects when using the plasma processing apparatus of the embodiment equipped with the structure of the narrow gap portion 4 and the annual extension portion 12b of the ground shield 12. FIG. 2B shows the measurement results of the confining effects when using the conventional plasma processing apparatus which is equipped with the narrow gap constructive member 19 made of the insulating material shown in FIG. 4 in place of the structure of the narrow gap portion 4 and the annular extension portion 12b of the earth shield 12 according to the embodiment.

Figure 4:
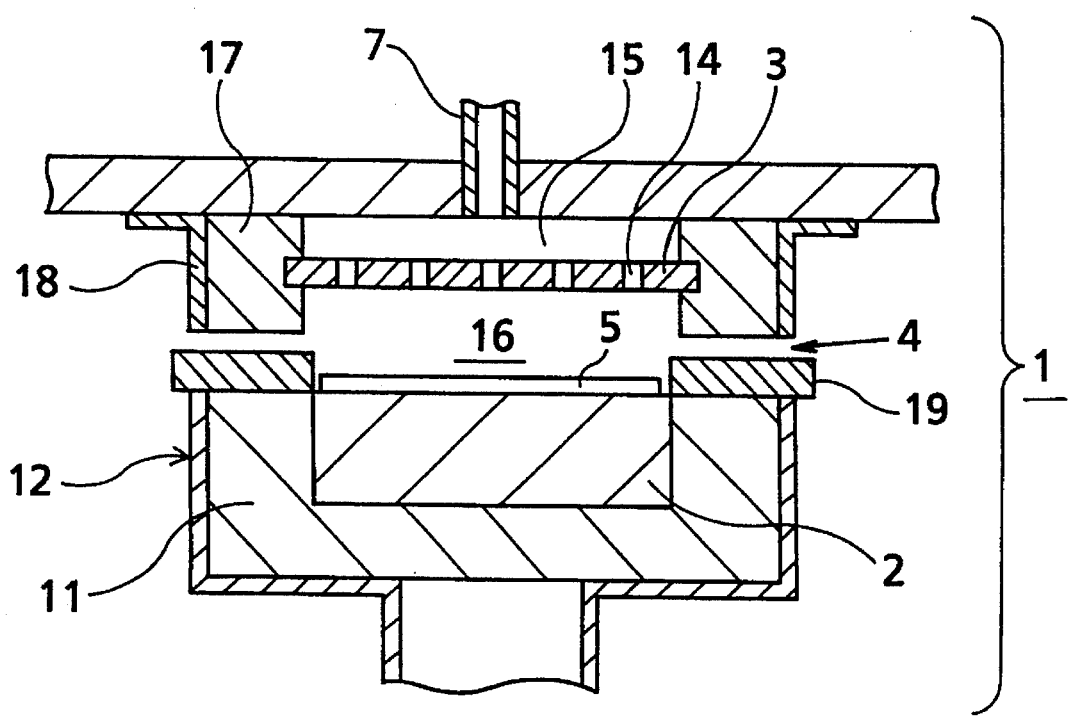
FIG. 4 shows a schematic sectional view of an opposed electrode unit of a conventional plasma processing apparatus.

Each of these graphs represents the relationship between the chamber pressure in the vacuum processing chamber 1 and the distance "d" of the narrow gap portion 4. The distance "d" in FIG. 2A represents a distance between the cover rings 13 and 17 as shown in FIG. 1. In contrast, the distance "d" in FIG. 2B represents a distance between the cover ring 17 and the narrow gap constructive member as shown in FIG. 4. The areas below the respective curves (hatched areas) in FIGS. 2A and 2B show ranges of the distances "d" where the plasma can be confined into the space 16 sandwiched between the electrodes 2 and 3. On the other hand, the areas above the respective curves indicate ranges of the distances "d" where discharge occurs in the narrow gap portion 4, so that the plasma cannot be confined into the space 16. As a consequence, it can be confirmed that the distance "d" of the narrow gap portion 4 in the plasma processing apparatus capable of confining the plasma is larger in the present invention than in conventional apparatuses.

In other words, assuming now that the pressure in the vacuum processing chamber 1 is for example 10 Pa, the distance of the narrow gap portion required for confining the plasma can be set to approximately 5 mm in the present invention. Conversely, the distance of the narrow gap portion required for confining the plasma must be maintained as approximately 2 mm in the conventional plasma processing apparatus.

Since the larger the interval of the narrow gap portion 4, the higher the conductance thereof becomes, the difference between the pressure in the vacuum processing chamber 1 and the pressure in the space 16 sandwiched between the electrodes 2 and 3 can be made smaller with the increase of the interval. As a result, in the present embodiment, the pressure in the etching space of the wafer 5 can be set to a lower value (namely, a pressure higher than 1 to 2 Pa and lower than 10 Pa), and thus fine processing of the wafer is made possible.

Figure 3:
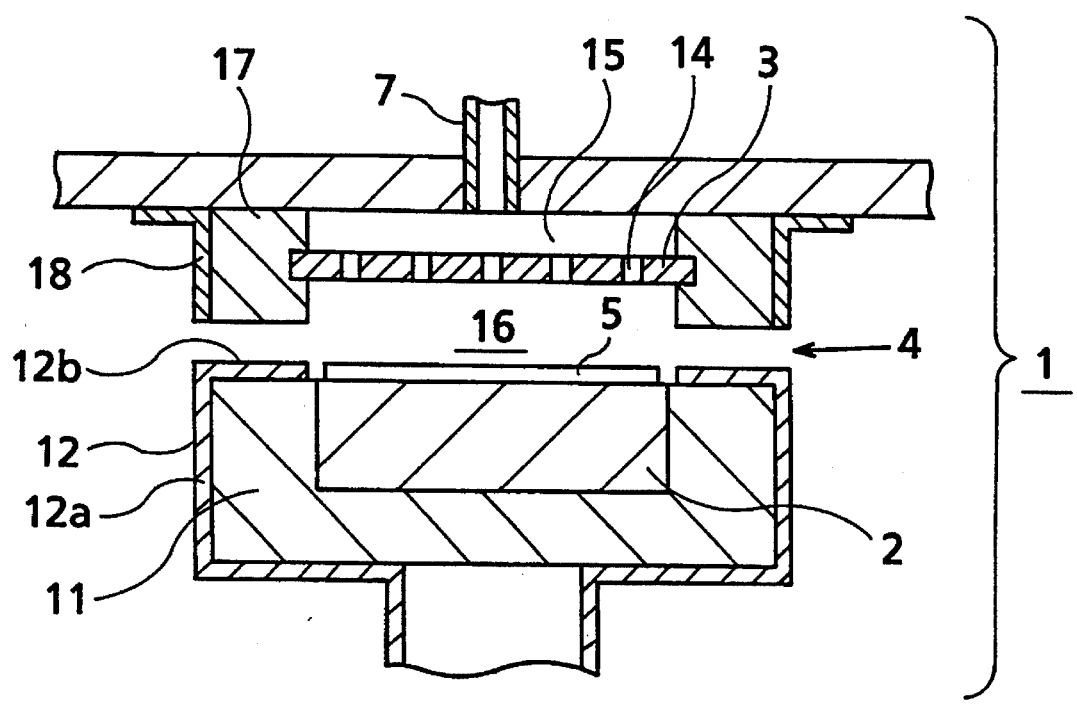
FIG. 3 is a schematic sectional view showing an opposed electrode unit according to another embodiment in which a cover ring is not utilized.

As shown in the schematic diagram of FIG. 3, the cover ring 13 may not be provided in another embodiment of the plasma processing apparatus. In this case, in order to prevent discharge occurring between the inside edge portion of the annular extension portion 12b of the ground shield 12 and either the outer edge portion of the wafer 5 or the electrode 2, the distance therebetween must be set to be approximately 1 mm, for example, so that discharge does not begin to occur therebetween.

The insulating member 11 provided between the electrode 2 and the ground shield 12 may also be omitted to the extent that the distance between the electrode 2 and the ground shield 12 is set to a value that discharge does not begin to occur therebetween.

Like the ground shield on the electrode 2 side, the ground shield 18 provided on the side of the electrode 3 may be equipped with an annular extension portion extending into the narrow gap portion 4. By the providing of the annular extension portion of the ground shield 18, it is conceivable to restrict the surface charge-up phenomenon of the cover ring 17 made of the insulating material.

It should be noted that although the above-described embodiments employ such an arrangement that the wafer is supported on the side of the electrode to which the high frequency power is applied, the present invention may also be applied to a narrow gap type plasma processing apparatus known as an anode coupling type in which the wafer is supported on the side of the electrode biased at the ground potential. In this case, similar effects to those of the above-described embodiments can be achieved.

As set out above, according to the present invention, since the interval of the narrow gap portion is widened to increase the conductance thereof the narrow gap portion, the pressure in the space for plasma processing can be lowered, so that fine processing of the wafer can be realized.

What is claimed is:

1. A plasma processing apparatus for processing a surface of a substrate by a reactive gas plasma, comprising:

a vacuum processing chamber for maintaining a vacuum therein;

first and second electrodes in said vacuum processing chamber in parallel and opposite each other, said first electrode being applied with a high frequency power while said second electrode being grounded so that a reactive gas plasma is produced at a space between said first and second electrodes, said substrate is supported by either one of said first and second electrodes;

a narrow gap portion formed along peripheries of said first and second electrodes, whose distance is narrower than a distance between central portions of said first and second electrodes;

a ground shield made of conductive material provided around said first electrode to which high frequency power is applied so that said ground shield surrounds an outside surface of said first electrode; and an annular extension ground shield portion which extends into said narrow gap portion, said annular extension ground shield portion being continuous with said ground shield and being made of a conductive metal.

2. A plasma processing apparatus as claimed in claim 1, wherein an insulating member is interposed between said ground shield and said outside surface of said first electrode.

3. A plasma processing apparatus for processing a surface of a substrate by a reactive gas plasma, comprising:

a vacuum processing chamber for maintaining a vacuum therein;

first and second electrodes in said vacuum processing chamber in parallel and opposite each other, said first electrode being applied with a high frequency power while said second electrode being grounded so that a reactive gas plasma is produced at a space between said first and second electrodes, said substrate is supported by either one of said first and second electrodes;

a narrow gap portion formed along peripheries of said first and second electrodes, whose distance is narrower than a distance between central portions of said first and second electrodes;

a ground shield made of conductive material provided around said first electrode to which high frequency power is applied so that said ground shield covers an outside surface of said first electrode; and an annular extension ground shield portion which extends into said narrow gap portion from an edge portion of said earth shield, wherein an annular cover ring made of insulating material which has an opening portion larger than said substrate to be processed is provided on a surface of said first electrode to which high frequency power is applied, and said cover ring covers said annular extension portion of said ground shield.

4. A plasma processing apparatus as claimed in claim 3, wherein an insulating member is interposed between said shield shield and said outside surface of said first electrode.

5. A plasma processing apparatus as claimed in claim 3, wherein said cover ring is designed with sufficient width for an insulating withstand voltage between said first electrode and an inner edge portion of said annular extension portion of said ground shield to be maintained.

6. A plasma processing apparatus as claimed in claim 3 further comprising: an annular cover ring made of insulating material for covering an outer peripheral of said second electrode, and a second ground shield made of conductive material is provided on an outside of said annular cover ring.

7. A plasma processing apparatus for processing a surface of a substrate by a reactive gas plasma, comprising:

a vacuum processing chamber for maintaining a vacuum therein;

first and second electrodes in said vacuum processing chamber in parallel and opposite each other, said first electrode being applied a high frequency power while said second electrode being grounded so that a reactive gas plasma is produced at a space between said first and second electrodes, said substrate is supported by either one of said first and second electrodes;

a narrow gap portion formed along peripheries of said first and second electrodes, whose distance is narrower than a distance between central portions of said first and second electrodes;

a ground shield made of conductive material provided around said first electrode to which high frequency power is applied so that said ground shield covers an outside surface of said first electrode;

an annular extension ground shield portion which extends into said narrow gap portion from an edge portion of said earth shield;

an annular cover ring made of insulating material for covering an outer peripheral of said second electrode; and a second ground shield made of conductive material provided on an outside of said annular cover ring.

* * * * *